United States Patent [19]

Rolfe et al.

[11] 4,443,882
[45] Apr. 17, 1984

[54] SINGLE TERMINAL NEGATIVE CAPACITANCE GENERATOR FOR RESPONSE TIME ENHANCEMENT

[75] Inventors: Robert M. Rolfe, Summit; Masakazu Shoji, Warren, both of N.J.

[73] Assignee: Bell Telephone Laboratories, Incorporated, Murray Hill, N.J.

[21] Appl. No.: 333,400

[22] Filed: Dec. 22, 1981

[51] Int. Cl.³ ...................... H04L 25/08; H03H 11/48
[52] U.S. Cl. ...................................... 375/36; 333/214
[58] Field of Search .................. 179/170 G; 333/213, 333/214, 216; 455/39; 370/51, 52; 375/36

[56] References Cited

U.S. PATENT DOCUMENTS

Re. 29,080  12/1976  Kiko ..................................... 333/214
4,158,878   6/1979  Forward ............................. 333/216

Primary Examiner—Marc E. Bookbinder
Attorney, Agent, or Firm—Irwin Ostroff

[57] ABSTRACT

The combination of an amplifier with a capacitor connected between an input and output terminal is coupled to a data bus to effectively reduce the effective capacitance on the bus and thus enhance the response time of information sent through the data bus.

2 Claims, 1 Drawing Figure

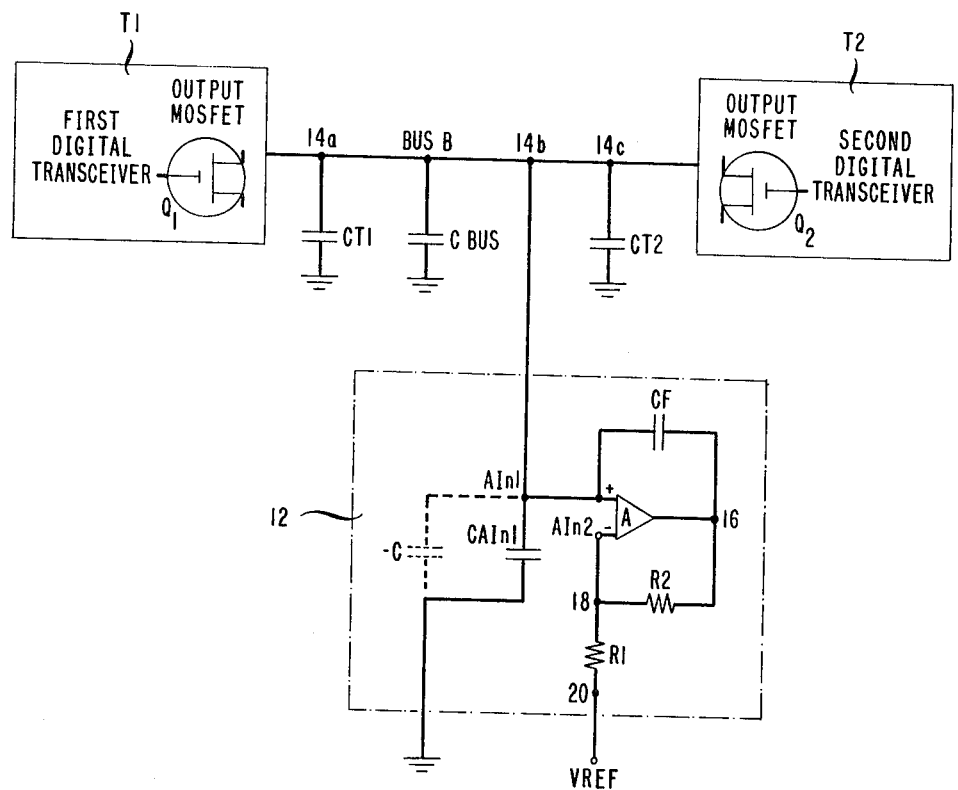

SINGLE TERMINAL NEGATIVE CAPACITANCE GENERATOR FOR RESPONSE TIME ENHANCEMENT

BACKGROUND OF THE INVENTION

This invention relates to means for enhancing the speed of transfer of information from one source to another and specifically for capacitance reduction circuit means which is coupled to a data bus that connects a transmitter and receiver or two transceivers.

Many of today's electronics systems use MOS circuitry which selectively has to drive a relatively high capacitance line (bus). One avenue to try and enhance response time is to increase the physical size of all the MOS drive devices so as to increase the drive capability by lowering the resistance. This also increases the capacitance on the bus which degrades response time. A point is reached at which increasing the size of the MOS driver devices proportionally increases the capacitance on the bus such that there is little or no enhancement of response time.

It is desirable in many instances to enhance the response time between various interconnected MOS circuits beyond what improvement can be achieved by increasing the physical size of the MOS driver devices.

SUMMARY OF THE INVENTION

One embodiment of the present invention is directed to the combination of an amplifier, a capacitance means connected between a first input terminal and an output terminal of the amplifier, and conduit means (bus, data bus, conductor) which is coupled to the first input terminal of the amplifier. The bus couples a transmitter at one end to a receiver at the other end or couples two transceivers. The response time of signals passing between the transmitter and receiver through the bus is proportional to the total load capacitance associated with the transmitter, the receiver, and the bus. Proper selection of the characteristics of the amplifier, the value of the capacitance means, and the ratio of the capacitance means to the total load capacitance, facilitates a reduction in the total capacitance between transmitter and receiver. This provides an enhancement of the response time.

These and other novel features and advantages of the present invention are better understood from consideration of the following detailed description taken in conjunction with the accompanying drawing.

BRIEF DESCRIPTION OF THE DRAWING

The FIGURE illustrates an embodiment of the present invention.

DETAILED DESCRIPTION

Referring now to the FIGURE, there is illustrated a system 10 comprising a first transceiver T1, a second transceiver T2, and a negative capacitance generator which is illustrated within dashed line rectangle 12 and may be denoted as negative capacitance generator 12 or circuitry 12 or generator 12. F.E.T's Q1 and Q2 are illustrated as part of T1 and T2, respectively. A capacitance CT1 is associated with an input/output terminal 14a of T1 and a capacitance CT2 is associated with an input/output terminal 14c of T2. Terminals 14a and 14c are electrically coupled together by conduit means (bus, data bus, conductor) Bus B. Bus B has a capacitance CBus associated therewith which is illustrated as a single capacitor. CBus is actually distributed along the entire length of B. Generator 12, which is coupled to a terminal 14b of Bus B, acts to enhance the response time of information sent between T1 and T2 through Bus B by effectively reducing the total capacitance between T1 and T2.

Negative capacitance generator 12 comprises an amplifier A, a first capacitance means which is illustrated as capacitor CF, a second capacitor CAIn1, which is the input capacitance of A, and first and second resistors R1 and R2. CF has a first terminal connected to a first plus input terminal AIn1 of A, to a terminal 14b along Bus B, and to a first terminal of capacitor CAIn1. AIn1 also serves as the generator 12 output terminal. A second terminal of CF is connected to an output terminal 16 of A. R1 is connected by a first terminal to a terminal 20 and to a reference potential VRef and by a second terminal to a first terminal as R2, to a second input minus terminal AIn2 of A, and to a terminal 18. A second terminal of R2 is connected to terminal 16. The ratio of R2 to R1 plays a role in determining the gain of A. In some cases R1 and R2 are not needed as many amplifiers have fixed gains. CAIn1 is the parasitic input capacitance associated with input terminal AIn1 of A.

When generator 12 is operating the equivalent capacitance at output terminal AIn1 of generator 12 is the $-C$ capacitor illustrated coupled between terminal AIn1 and ground potential. Generator 12 may be considered a single terminal negative capacitance generator since the AIn1 terminal serves as both an input and output terminal and is the only terminal coupled to Bus B.

The equivalent capacitance between T1 and T2, without negative capacitance generator 12 being disconnected from 14b, is the simple sum of the capacitances of CT1, CT2 and CBus. Assuming that T1 is acting as a transmitter and T2 is acting as a receiver, the equivalent resistance between T1 and T2 is the sum of the output resistance of T1, the resistance of Bus B, and the input resistance of T2. Assuming that T1 is acting as a receiver and T2 is acting as a transmitter, the equivalent resistance between T1 and T2 is the sum of the output resistance of T2, the resistance of Bus B and the input resistance of T1. These resistances, which are denoted as REq, are not illustrated in the drawing. The RC time constant which plays a significant role in determining the response time of information sent between T1 and T2 is thus (REq)(CT1+CBus+CT2).

Negative capacitance generator 12, with a properly selected response time, with proper capacitance values selected for CF and CAIn1, and with proper ohmic values selected for R1 and R2, causes the effective capacitance appearing at terminal AIn1 to have a negative value such that same actually reduces the total capacitance appearing at 14b to a value which is less than the sum of CT1+CBUS+CT2. Thus the equivalent capacitance between terminals 14a and 14c is reduced to a value which is less than the sum of CT1+CBus+CT2. This enhances the response time of information transmitted between T1 and T2 through Bus B by lowering the RC time constant to (REq)(CT1+CBus+CT2−C).

An embodiment of system 10 was built and tested. REq was 1000 ohms, the total capacitance of CT1+CBus+CT2 was 91 pF, the capacitance of CF was 70 pF, and VRef=0 volts. Amplifier A was MSK 880 operational amplifier whose gain was set to 2 by selecting R1=R2=196 ohms. A 3 pF capacitor (not illustrated) was connected between terminals 16 and 18 to help stabilize the MSK 880 amplifier. The response time of the MSK 880, using the above denoted values of resistances of R1 and R2, is typically 5 nanoseconds. The rise time propagation delay (the time delay from the time the input signal is at 50% of the transition between a first logic level and the opposite logic level until the output reaches the corresponding 50% point) without generator 12 connected to 14b of Bus B was 100 nanoseconds. The measured rise time propagation delay was 45 nanoseconds with generator 12 connected to Bus B.

In many useful cases the response time of the amplifier is selected such that it is approximately two times or greater less than the enhanced response time expected. The gain of the amplifier in many useful cases is two or greater.

The response time of information sent between T1 and T2 through Bus B is proportional to the gain and response time of amplifier A. Generally as the gain of A increases the response time of A decreases (is enhanced) and the response time of information sent between T1 and T2 is enhanced (decreases). Generally as the ratio of CF to the total uncompensated capacitance loading terminal 14b of Bus B decreases the response time of information sent between T1 and T2 is enhanced (decreases). A typical range for this capacitance ratio is 0.001 to 100.

Generator 12 is designed such that negative capacitance generated at the AIn1 terminal is not sufficient to cause sustained oscillations between T1 and T2. It is also desirable to design generator 12 to limit information signal over shouts and ringing.

The embodiments described herein are intended to be illustrative of the general principles of the invention. Various modifications are possible consistent with the spirit of the invention. For example, T1 can be just a transmitter and T2 can be just a receiver or T2 can just be a transmitter and T1 can just be a receiver. Still further, a variety of different size capacitors and different amplifiers with different gains and response times can be used. Still further, an interrupt device, which might typically be an MOS transistor, can be used in series with Bus B in order to allow T1 and T2 to selectively be decoupled from each other. An amplifier and/or a level shifter circuit could also be used in series with Bus B to provide amplification and/or level shifting of signals being transmitted between T1 and T2 through Bus B. Still further, additional negative capacitance generators, like generator 12, can be coupled to different points along Bus B to further cancel load capacitance thereon and thus further enhance response time. Still further, additional transceivers and/or receivers, and/or transmitters may be coupled to Bus B.

What is claimed is:

1. In combination:
a data bus conductor;
said data bus conductor having a capacitance associated therewith and having first and second terminals;
first and second circuit means each having capacitance associated therewith and being coupled to the first and second terminals, respectively;
the first circuit means comprising a transceiver or a transmitter or a receiver;
the second circuit means comprising a transceiver or a transmitter or a receiver;
one of the first or second circuit means comprising at least a transmitter and the other circuit means comprising at least a receiver;
said transmitter having respective output MOS field effect switching devices;
an amplifier having a first input terminal and having an output terminal;
capacitance means having first and second terminals coupled to the input terminal and the output terminal of the amplifier, respectively;
only the first input terminal of the amplifier being coupled to the data bus conductor;
the gain of the amplifier and the value of the capacitor means being selected such that total load capacitance on the data bus conductor including at least the capacitances of both said circuit means, said bus conductor and the effective capacitance of said amplifier/capacitance means is less than would be the case if the amplifier and capacitive means were not coupled to the data bus conductor; and
the gain of the amplifier is approximately two or greater, and the amplifier has a response time which is approximately two times or greater less than a desired response time of information transmitted through the data bus conductor.

2. A digital system comprising:
a digital transmitter having an MOS a field effect output transistor coupled to an output terminal thereof which has a capacitance associated therewith;
a digital receiver having an input terminal which has a capacitance associated therewith;
a data bus conductor having two ends and having a capacitance associated therewith and being coupled by one end to the output terminal of the transmitter and being coupled by the other end to the input terminal of the receiver;
an amplifier having a first input terminal and having an output terminal;
capacitor means having first and second terminals coupled to the input terminal and output terminal of the amplifier, respectively;
only the first input terminal of the amplifier being coupled to the data bus conductor;
the amplifier has a gain of approximately two or greater; and
the amplifier has a response time which is approximately two times or greater less than a desired response time of information transmitted from the transmitter to the receiver.

* * * * *